(12) United States Patent
Wang et al.

(10) Patent No.: US 7,375,555 B1
(45) Date of Patent: May 20, 2008

(54) FIVE VOLT TOLERANT INTEGRATED CIRCUIT SIGNAL PAD WITH THREE VOLT ASSIST

(75) Inventors: Guoli Wang, Gilbert, AZ (US); Joseph A. Thomsen, Gilbert, AZ (US); Russell Cooper, Mesa, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/748,771

(22) Filed: May 15, 2007

(51) Int. Cl.
*H03K 19/0175* (2006.01)
*H03K 19/00* (2006.01)

(52) U.S. Cl. .......................................... 326/81; 326/58
(58) Field of Classification Search ............ 326/56–58, 326/63, 80–81
See application file for complete search history.

(56) References Cited

U.S. PATENT DOCUMENTS

| | | | |
|---|---|---|---|
| 6,043,680 A * | 3/2000 | Dasgupta | 326/81 |
| 6,150,843 A * | 11/2000 | Shiffer et al. | 326/80 |
| 6,323,684 B1 * | 11/2001 | Oshima | 326/81 |
| 6,353,333 B1 * | 3/2002 | Curd et al. | 326/81 |
| 7,002,372 B2 * | 2/2006 | Huber et al. | 326/81 |
| 7,049,847 B2 * | 5/2006 | Kitazawa et al. | 326/56 |
| 2007/0170955 A1 * | 7/2007 | Narwal et al. | 326/83 |

* cited by examiner

*Primary Examiner*—Rexford Barnie
*Assistant Examiner*—Jason M Crawford
(74) *Attorney, Agent, or Firm*—Baker Botts L.L.P.

(57) ABSTRACT

A five volt tolerant integrated circuit signal pad having an initial fast pull-up to three volts and then operating as an open drain output with an external resistor for pulling up the output from about three volts to about five volts. The initial fast (active) pull-up is accomplished with active devices that reduces the overall pull-up time of a newer technology (lower operating voltage) integrated circuit output when transitioning from a logic 0 to a logic 1. Circuits of the integrated circuit output driver protect the internal operating circuit nodes from excessive voltage and leakage currents that would otherwise result from a voltage on the signal pad that is more positive than the operating voltage of the integrated circuit.

7 Claims, 1 Drawing Sheet

US 7,375,555 B1

FIVE VOLT TOLERANT INTEGRATED CIRCUIT SIGNAL PAD WITH THREE VOLT ASSIST

RELATED PATENT APPLICATION

Co-pending and commonly owned U.S. patent application Ser. No. 11/215,775, entitled "Output Structure Having ESD and Increased Voltage Withstand Protection By Using Different Thickness Gate Oxides" (as amended), filed Aug. 30, 2005; by Yach, et al., is incorporated by reference herein for all purposes.

TECHNICAL FIELD

The present disclosure relates to level shifting for integrated circuit input-outputs (I/Os), and more particularly, to a five volt tolerant I/O signal pad with three volt assist.

BACKGROUND

Integrated circuits may function at different operating voltages depending on the fabrication process used and the intended purpose of the integrated circuit. Legacy integrated circuit input-outputs (I/Os) typically operate at either about zero or about five volts, e.g., logic 0 and logic 1. However, the newer and smaller process technology integrated circuits typically operate at either about zero or about three volts, e.g., $V_{DD}$ of about 3.3 volts, because new high circuit density fabrication processes produce transistors that cannot operate safely above a 3.3 volt $V_{DD}$.

When interfacing five volt legacy integrated circuit devices to the newer technology 3.3 volt devices, external voltage level shifters or open drain outputs may be used. The external voltage level shifters add expense, complexity and take up space on a printed circuit board. Traditional open drain outputs have operating performance limited by the pull-up resistor in combination with the inherent circuit capacitance of each open drain output.

SUMMARY

Therefore there is a need for a five volt tolerant integrated circuit output having an initial fast pull-up to three volts and then operating as an open drain output with an external resistor for pulling up the output from about three volts to about five volts. The initial fast (active) pull-up to about three volts reduces the overall pull-up time of a newer technology integrated circuit output when transitioning from a logic zero to a logic 1.

According to one specific example embodiment of this disclosure, an integrated circuit with a signal pad and circuit coupled thereto having higher voltage tolerance with lower voltage assist may comprise: an integrated circuit signal pad; a first N-channel metal oxide semiconductor (NMOS) transistor (142) having a drain coupled to the integrated circuit signal pad and a gate coupled to an operating voltage; a second NMOS transistor (128) having a source coupled to a power common and a drain coupled a source of the first NMOS transistor (142); a first P-channel metal oxide semiconductor (PMOS) transistor (126) having a drain coupled to the integrated circuit signal pad and the drain of the second NMOS transistor (128); a second PMOS transistor (124) having a drain coupled to a source of the first PMOS transistor (126), and a source of the second PMOS transistor (124) coupled to the operating voltage; a third PMOS transistor (122) having a drain coupled to the integrated circuit signal pad and a source coupled to a gate of the second PMOS transistor (124); a fourth PMOS transistor (114) having a drain coupled to the gate of the second PMOS transistor (124) and the source of the third PMOS transistor (122), the fourth PMOS transistor (114) having a source coupled to a five volt control signal; a third NMOS transistor (116) having a drain coupled to the gate of the second PMOS transistor (124) and the source of the third PMOS transistor (122), the third NMOS transistor (116) has a gate coupled to the operating voltage and a source coupled to the five volt control; a fourth NMOS transistor (120) having a source coupled to the integrated circuit signal pad and a gate coupled to the operating voltage; a fifth PMOS transistor (118) having a source coupled to the integrated circuit signal pad and a gate coupled to the operating voltage; drains of the fourth NMOS transistor (120) and the fifth PMOS transistor (118) are coupled to a gate of the fourth PMOS transistor (114); a gate of the first PMOS transistor (126) is coupled to a data out signal; a gate of the second NMOS transistor (128) is coupled to a data out enable signal; a first parasitic diode (132), the first parasitic diode (132) being formed between the source and the drain of the first PMOS transistor (126); and a second parasitic diode (134), the second parasitic diode (134) being formed between the source and the drain of the second PMOS transistor (124), wherein current flow through the second parasitic diode (134) drives the integrated circuit signal pad to substantially the operating voltage when the five volt control signal is at a logic 1 and the second parasitic diode (134) substantially prevents current flow from the integrated circuit signal pad to the operating voltage when the integrated circuit signal pad is at a voltage more positive than the operating voltage.

BRIEF DESCRIPTION OF THE DRAWINGS

A more complete understanding of the present disclosure thereof may be acquired by referring to the following description taken in conjunction with the accompanying drawings wherein.

Figure 1:
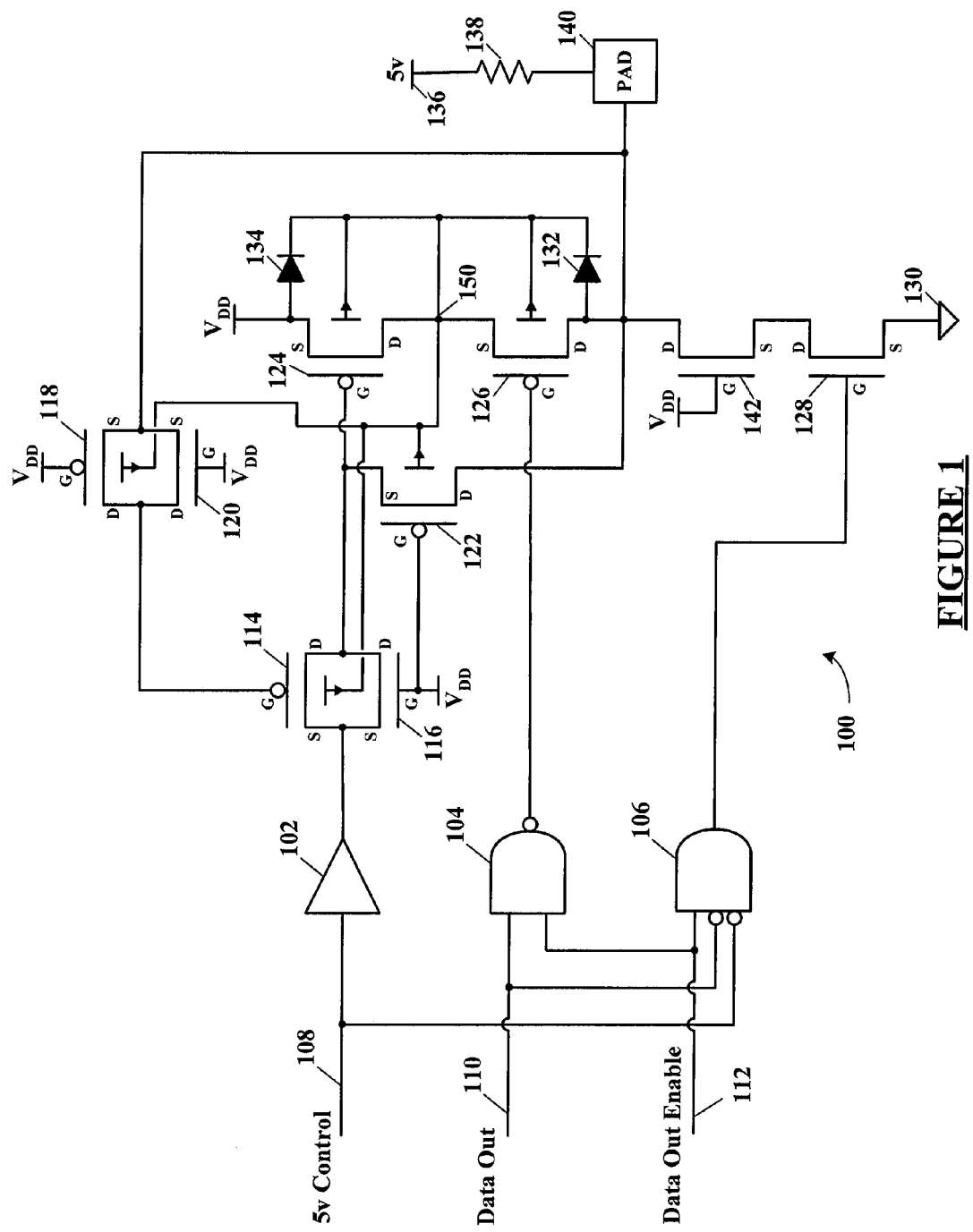
FIG. 1 illustrates a schematic diagram of a five volt tolerant input-output (I/O) circuit coupled to an integrated circuit I/O pad (external integrated circuit I/O connection), according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of a specific example embodiment is schematically illustrated. Like elements in the drawings will be represented by like numbers, and similar elements will be represented by like numbers with a different lower case letter suffix.

Referring to FIG. 1, depicted is a schematic diagram of a five volt tolerant input-output (I/O) circuit coupled to an integrated circuit I/O pad (external integrated circuit I/O connection), according to a specific example embodiment of this disclosure. The five volt tolerant I/O circuit, generally represented by the numeral 100, is coupled to an integrated circuit external connection I/O pad 140. The I/O pad 140 may be coupled to a pull-up resistor 138 that may also be coupled to a five volt source 136. The I/O pad 140 may be capable of bi-directional operation, e.g., input and output.

P-channel metal oxide semiconductor (PMOS) transistor 126, N-channel metal oxide semiconductor (NMOS) transistor 142 and N-channel metal oxide semiconductor (NMOS) transistor 128 form an output driver. The PMOS transistor 126 may be fabricated with a thicker gate oxide than the gate oxide of the PMOS transistor 124 for enhanced electrostatic discharge (ESD) and voltage withstand protection. The NMOS transistor 142 may be fabricated with a thicker gate oxide than the gate oxide of the NMOS transistor 142 for enhanced electrostatic discharge (ESD) and voltage withstand protection, as more fully described in co-pending and commonly owned U.S. patent application Ser. No. 11/215,775, entitled "Output Structure Having ESD and Increased Voltage Withstand Protection By Using Different Thickness Gate Oxides," filed Aug. 30, 2005; by Yach, et al., and is incorporated by reference herein for all purposes.

A PMOS transistor 124 is placed in series with the PMOS transistor 126 and the NMOS transistor 128, and a parasitic diode 134 substantially prevents unwanted current flow from the I/O pad 140 to $V_{DD}$ when the voltage thereon is greater than $V_{DD}$, e.g., greater than 3.3 volts. When a five volt control 108 is at a logic 1, it will enable a three volt assist fast pull-up output at the I/O pad 140. The five volt control 108 may be used in combination with the logic circuits described herein to effectively prevent unwanted leakage current paths, while maintaining regular input/output functionality during five volt operation, and the I/O pad 140 as an output during three volt operation (e.g., five volt control 108 at logic 0).

When the five volt control 108 is at a logic 1, the I/O pad 140 behaves as either a five volt tolerant input or with the external five volt pull-up resistor 138 as a five volt output. For example, to initiate an internal diode, e.g., parasitic diode 134, assist to pull-up to $V_{DD}$, data out 110 and data out enable 112 will be at logic 1, and will cause the gate of the PMOS transistor 126 to be at a logic 1. The parasitic diode 134 quickly drives node 150 to $V_{DD}$. Node 150 is coupled to the source of PMOS transistor 126. When the gate of PMOS transistor 126 goes from a logic 1 to a logic 0, e.g., substantially at the same potential as the power supply common 130, the PMOS transistor 126 source-drain path becomes conductive and will quickly pull the I/O pad 140 to $V_{DD}$, e.g., 3.3 volts. Thereafter, the pull-up resistor 138 will continue to pull the I/O pad 140 toward the five volt source 136.

When the voltage on the I/O pad 140 is more positive than $V_{DD}$, the node 150 will follow the voltage on the I/O pad 140 through the parasitic diode 132 (being in conduction). However, diode 134 will prevent substantially any current flow from the I/O pad 140 (greater than $V_{DD}$) to the internal $V_{DD}$. Once the I/O pad 140 becomes more positive than $V_{DD}$+Vtp, PMOS transistor 122 will conduct and the gate of PMOS transistor 124 will be at substantially the same voltage as the voltage on the I/O pad 140. Thus the PMOS transistor 124 will be fully turned off, preventing any leakage current therethrough.

Since the voltage at node 150 substantially tracks the voltage on the I/O pad 140 due to diode 132 being forward biased, there is substantially no leakage current through PMOS transistor 126. When the voltage on the I/O pad 140 is more positive than $V_{DD}$+Vtp, The PMOS transistor 118 conducts and the gate of the PMOS transistor 114 is at a voltage substantially the same as the voltage on the I/O pad 140. PMOS transistor 114 is fully turned off so as to avoid the five volt level from reaching the output of the buffer 102 and possibly causing damage thereto.

Except for the initial fast pull-up from a logic zero to $V_{DD}$ at the I/O pad 140 which requires data out 110 and data out enable 112 to be at logic 1, the logic states of the data out 110 and data out enable 112 make no difference because the NMOS transistor 128 is always turned off by the five volt control 108, and the PMOS transistor 124 is turned off either by the five volt control 108 (e.g., when the voltage at the I/O pad 140 is less than or equal to $V_{DD}$+$V_{TP}$) or by the PMOS transistor 122 being in conduction (e.g., when the voltage at the I/O pad 140 is greater than $V_{DD}$+$V_{TP}$) as described hereinabove. Therefore the node 150 will always track the voltage on the I/O pad 140, and the PMOS transistor 126 will have substantially no current flow therethrough. The N-wells of the PMOS transistors 114, 118, 122, 124 and 126 may all be tied to the node 150 so as to maintain the same voltage level and to avoid forward biasing of these transistors when the voltage on the pad 140 is more positive than $V_{DD}$.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit with a signal pad and circuit coupled thereto having higher voltage tolerance with lower voltage assist, comprising:
    an integrated circuit signal pad;
    a first N-channel metal oxide semiconductor (NMOS) transistor (142) having a drain coupled to the integrated circuit signal pad and a gate coupled to an operating voltage;
    a second NMOS transistor (128) having a source coupled to a power common and a drain coupled a source of the first NMOS transistor (142);
    a first P-channel metal oxide semiconductor (PMOS) transistor (126) having a drain coupled to the integrated circuit signal pad and the drain of the first NMOS transistor (142);
    a second PMOS transistor (124) having a drain coupled to a source of the first PMOS transistor (126), and a source of the second PMOS transistor (124) coupled to the operating voltage;
    a third PMOS transistor (122) having a drain coupled to the integrated circuit signal pad and a source coupled to a gate of the second PMOS transistor (124);
    a fourth PMOS transistor (114) having a drain coupled to the gate of the second PMOS transistor (124) and the source of the third PMOS transistor (122), the fourth PMOS transistor (114) having a source coupled to a five volt control signal;
    a third NMOS transistor (116) having a drain coupled to the gate of the second PMOS transistor (124) and the source of the third PMOS transistor (122), the third NMOS transistor (116) has a gate coupled to the operating voltage and a source coupled to the five volt control;

a fourth NMOS transistor (120) having a source coupled to the integrated circuit signal pad and a gate coupled to the operating voltage;

a fifth PMOS transistor (118) having a source coupled to the integrated circuit signal pad and a gate coupled to the operating voltage;

drains of the fourth NMOS transistor (120) and the fifth PMOS transistor (118) are coupled to a gate of the fourth PMOS transistor (114);

a gate of the first PMOS transistor (126) is coupled to a data out signal;

a gate of the second NMOS transistor (128) is coupled to a data out enable signal;

a first parasitic diode (132), the first parasitic diode (132) being formed between the source and the drain of the first PMOS transistor (126); and a second parasitic diode (134), the second parasitic diode (134) being formed between the source and the drain of the second PMOS transistor (124), wherein current flow through the second parasitic diode (134) drives the integrated circuit signal pad to substantially the operating voltage when the five volt control signal is at a logic 1 and the second parasitic diode (134) substantially prevents current flow from the integrated circuit signal pad to the operating voltage when the integrated circuit signal pad is at a voltage more positive than the operating voltage.

2. The integrated circuit according to claim 1, wherein the integrated circuit signal pad is an input pad when the data out enable signal is at a logic 0 and the five volt control is at a logic 1.

3. The integrated circuit according to claim 1, wherein the integrated circuit signal pad is an output pad when the data out enable signal is at a logic 1 and the five volt control is at a logic 0.

4. The integrated circuit according to claim 1, wherein the integrated circuit signal pad is at a logic 0 when the data out signal is at a logic 0, the data out enable signal is at a logic 1 and the five volt control is at a logic 0.

5. The integrated circuit according to claim 1, wherein the integrated circuit signal pad is at a logic 1 when the data out signal is at a logic 1, the data out enable signal is at a logic 1 and the five volt control is at a logic 0.

6. The integrated circuit according to claim 1, further comprising a pull-up resistor coupled to the integrated circuit signal pad and the voltage more positive than the operating voltage.

7. The integrated circuit according to claim 6, wherein the integrated circuit signal pad is at substantially the voltage more positive than the operating voltage when the five volt control signal is at a logic 1, the data out signal is at a logic 1 and the data out enable signal is at a logic 1.

* * * * *